United States Patent
Trivedi et al.

(10) Patent No.: US 9,621,163 B2
(45) Date of Patent: Apr. 11, 2017

(54) CURRENT STEERING LEVEL SHIFTER

(71) Applicant: Intel Corporation, Santa Clara, CA (US)

(72) Inventors: Amit R. Trivedi, Atlanta, GA (US); Jaydeep P. Kulkarni, Hillsboro, OR (US); Dinesh Somasekhar, Portland, OR (US); Muhammad M. Khellah, Tigard, OR (US); Carlos Tokunaga, Hillsboro, OR (US); James W. Tschanz, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/569,569

(22) Filed: Dec. 12, 2014

(65) Prior Publication Data

US 2016/0173092 A1    Jun. 16, 2016

(51) Int. Cl.
*H03L 5/00*     (2006.01)
*H03K 19/0175*  (2006.01)

(52) U.S. Cl.
CPC ................. *H03K 19/017509* (2013.01)

(58) Field of Classification Search
None
See application file for complete search history.

(56) References Cited

U.S. PATENT DOCUMENTS

| 8,274,848 | B2* | 9/2012 | Adams ........... G11C 7/1048 365/189.11 |
| 2008/0093935 | A1* | 4/2008 | Saito ............ G06K 19/0701 307/149 |
| 2012/0033508 | A1* | 2/2012 | Adams ........... G11C 7/1048 365/189.11 |
| 2012/0313686 | A1* | 12/2012 | Kikuchi ......... H03K 19/018521 327/333 |

* cited by examiner

*Primary Examiner* — Long Nguyen
(74) *Attorney, Agent, or Firm* — Green, Howard, & Mughal, LLP

(57) ABSTRACT

Described is an apparatus which comprises: a first power supply node to provide a first power supply; a second power supply node to provide a second power supply; a driver to operate on the first power supply, the driver to generate an output; and a receiver to operate on the second power supply, the receiver to receive the output from the driver and to generate a level-shifted output such that the receiver is operable to steer current from the second power supply to the first power supply.

13 Claims, 11 Drawing Sheets

Greater drop in N2 potential, much lower leakage through MP3 to ground

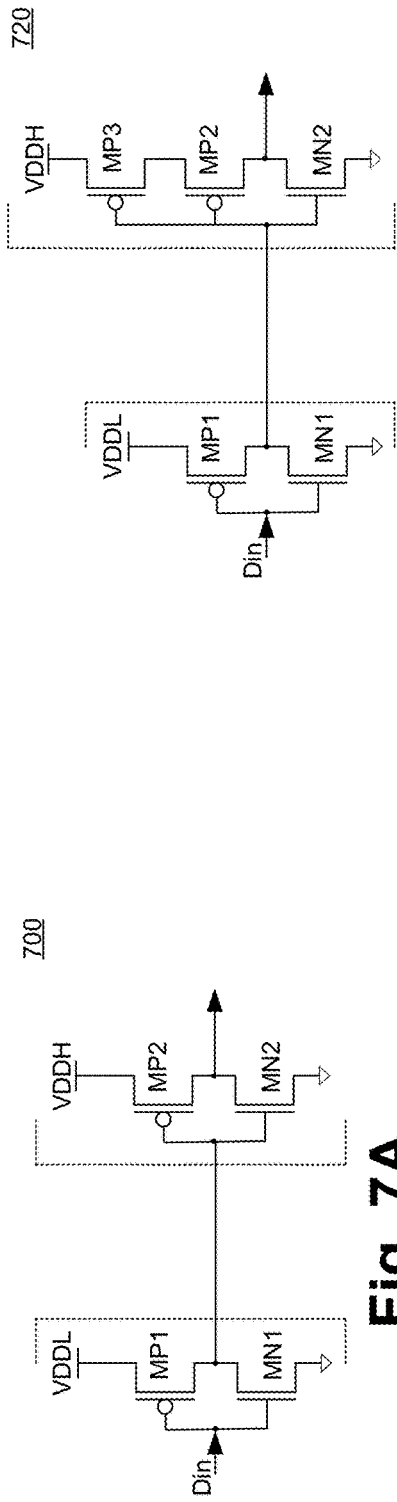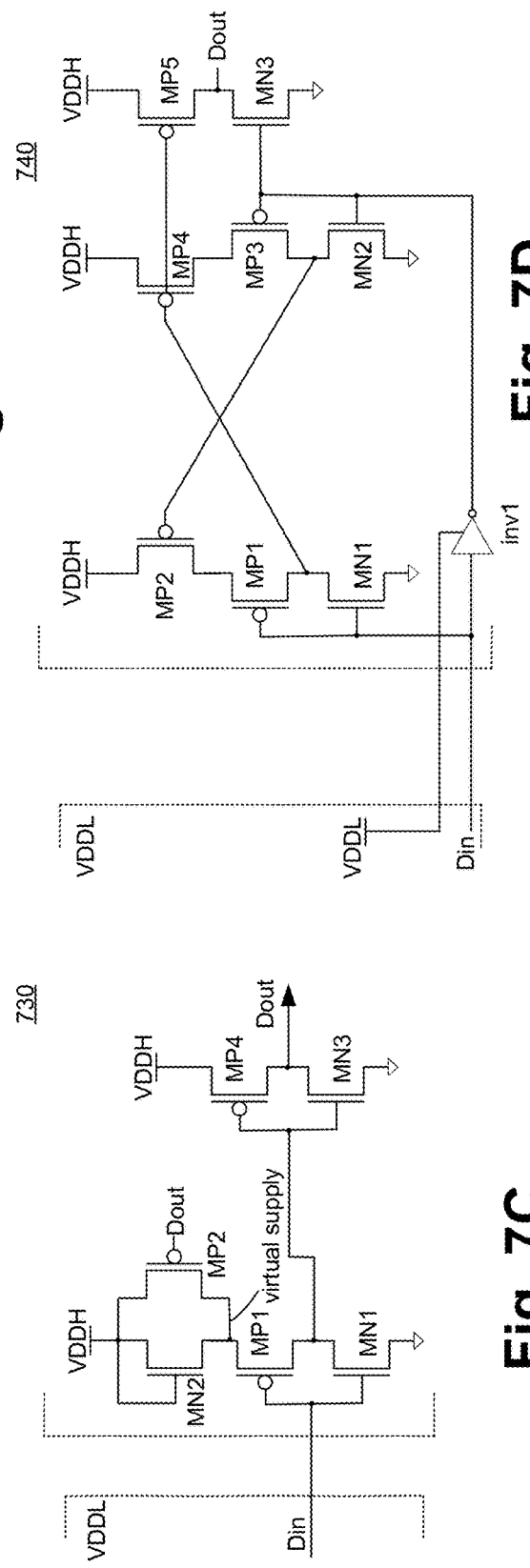

CURRENT STEERING LEVEL SHIFTER

BACKGROUND

Today, processors and system-on-a-chip (SoC) designs operate on multiple power supply levels. For example, input-output circuits (I/Os) generally operate at higher power supply levels than the core of the processor because I/Os may require higher voltage level swings to transfer data across transmission lines. The core of the processor generally operates at a lower power supply level to save power dissipation where most of the circuits reside. Similarly, Phase Locked Loops (PLLs) require quiet power supply levels that are shielded from the noise generated on the power supply levels from the core of the processor. In multi-core processors, each core may operate on a different power supply domain resulting in a complex system of multiple power supply domains between cores and within cores.

For circuits operating on one power supply domain to communicate with a circuit on another power supply domain, interface circuits are used. These interface circuits are called level-shifters.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 7A illustrates an inverter chain.
FIG. 7B illustrates a p-stacked inverter chain.
FIG. 7C illustrates a supply collapse level-shifter.
FIG. 7D illustrates an interruptible supply split output level-shifter.

DETAILED DESCRIPTION

Figure 1A:
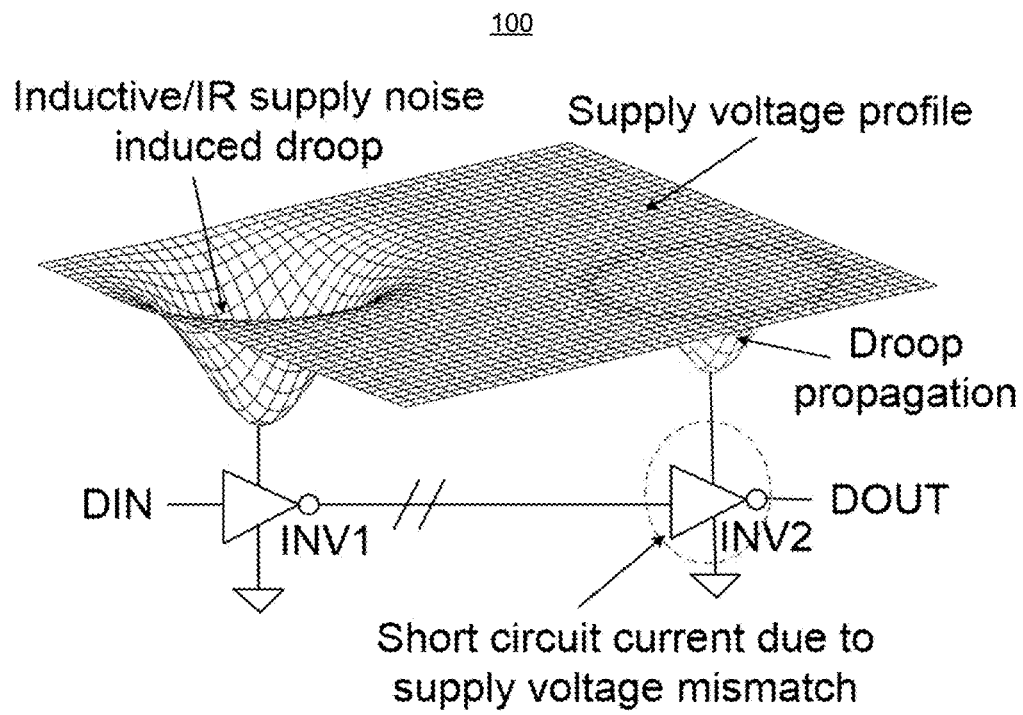
FIG. 1A illustrates a supply voltage profile across power supply nodes of two inverters to exhibit supply voltage mismatch between the two inverters.

Supply voltage mismatch between input and output (I/O) domains is a critical concern for digital I/O drivers. FIG. 1A illustrates a supply voltage profile 100 across power supply nodes of two inverters (INV1 and INV2) to exhibit supply voltage mismatch between the two inverters. Supply voltage profile 100 shows a localized droop on the supply node of inverter INV1 which occurs due to the inductive or resistive noise. Here, output signal level '1' from the inverter INV1 is drooped as well, which creates a short-circuit current in inverter INV2. Furthermore, if the short circuit current through I/O drivers is large enough, it can create another power supply droop as shown by the droop propagation in the power supply node of inverter INV2.

Figure 1B:
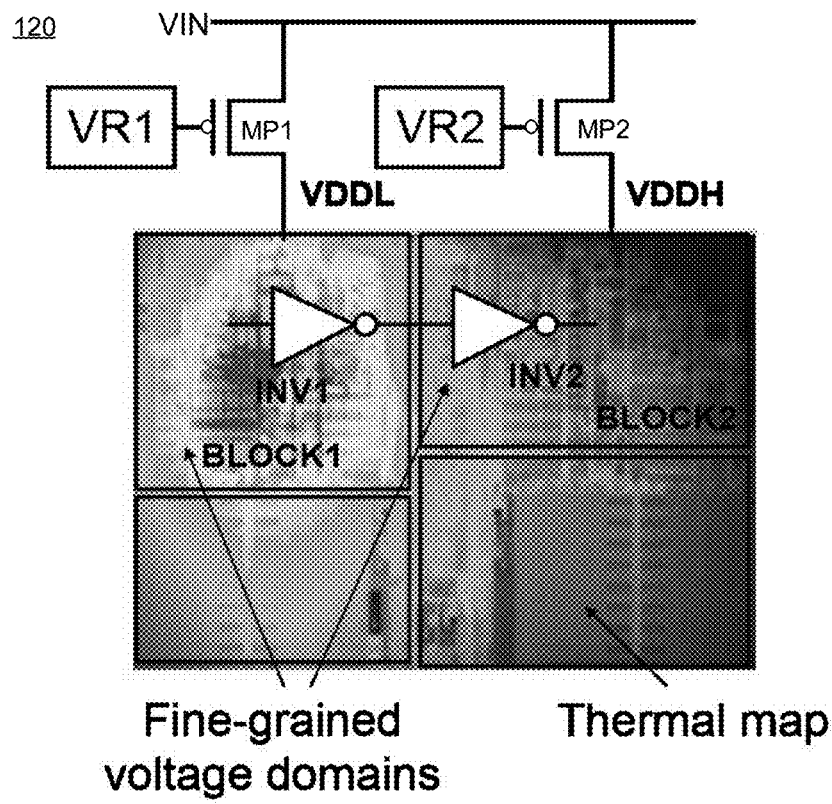
FIG. 1B illustrates a temperature profile between regions of two inverters to exhibit supply voltage mismatch scenarios for the two inverters.

FIG. 1B illustrates temperature profile 120 between regions of two inverters to exhibit supply voltage mismatch scenarios for the two inverters—INV1 and INV2. Temperature profile (or map) 120 is shown for two blocks—BLOCK 1 having inverter INV1 powered by VDDL, and BLOCK2 having inverter INV2 being powered by VDDH, where the voltage level of VDDL is less than the voltage level of VDDH. Here, the input supply VIN is provided to transistors MP1 and MP2, which are regulated by voltage regulators (VRs) VR1 and VR2, respectively. In this example, the regulated power supply provided by transistor MP1 is VDDL and the regulated power supply provided by transistor MP2 is VDDH.

Here, for the fine-grained voltage regulation case (i.e., when the difference between the voltage levels of VDDL and VDDH is small (e.g., 100 mV)), due to a higher temperature in BLOCK1 when its supply voltage is reduced from VDDH to VDDL, static current flows in the inverter INV2 driving output signal '0'. While the state-of-the-art level-shifters can avoid short circuit current dissipation in I/O drivers (here, inverters INV1 and INV2), these level-shifters incur a much larger delay at the smaller supply voltage mismatch, hence, are not suitable for the cases discussed above.

Figure 2:
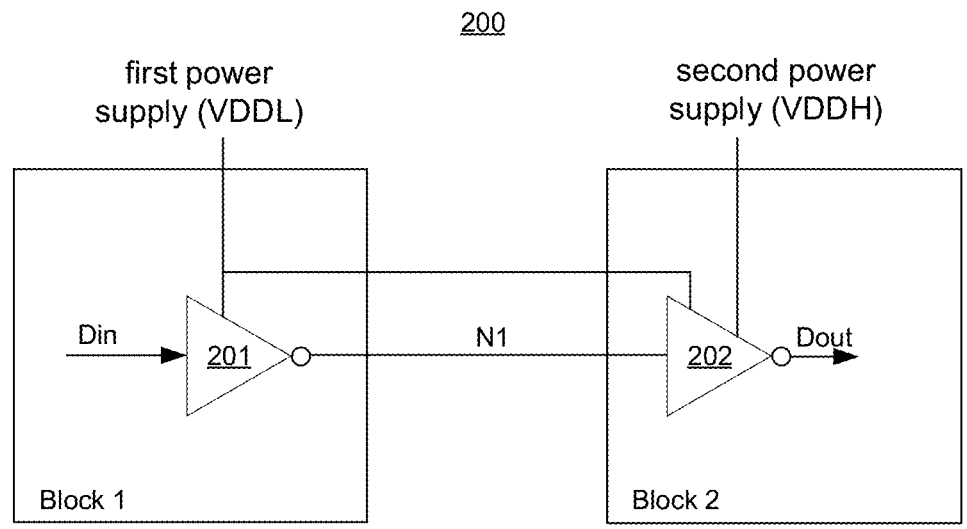
FIG. 2 illustrates a traditional usage model of a level-shifter between two power supply domains in which the level-shifter receives two power supplies.

FIG. 2 illustrates a traditional usage model 200 of a dual supply level-shifter between two power supply domains (indicated by Block 1 and Block 2) in which the dual supply level-shifter receives two power supplies (VDDL and VDDH). Dual supply level-shifters, such as cascode voltage switch logic level-shifter (CVLS) and interruptible supply split output (ISSO) level-shifter of FIG. 7D, require routing of both the low and high supply voltages (i.e., VDDL and VDDH) or of both the input signal and its complement (i.e., IN and INB). Hence, such dual supply level-shifters are not suitable for a finer-grained implementation due to the excessive routing overheads.

Some embodiments describe a current steering level-shifter to address some of the above issues with the traditional dual supply level-shifters. Some embodiments also describe a contention free current steering level-shifter which opportunistically utilizes a neighboring supply voltage rail for lower $V_{MIN}$ operation (where, $V_{MIN}$ is the minimum operating voltage level for a design).

There are many technical effects of various embodiments compared to the traditional level-shifters. For example, the current steering level-shifter of some embodiments has a low area overhead, exhibits high speed, and operates on a single supply voltage to tolerate supply voltage mismatch between power supply domains (e.g., I/O domains) to enable a fine-grained implementation. The current steering level-shifter of some embodiments enables a current steering mechanism between two voltage supply nodes and minimizes the wasted leakage (i.e., the current to the ground node). The current steering level-shifter of some embodiments includes a stacked configuration to enhance level-shifting even at a much higher voltage mismatch.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, optical, or wireless connection between the things that are connected, without any intermediary devices. The term "coupled" means either a direct electrical, optical, or wireless connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 3:
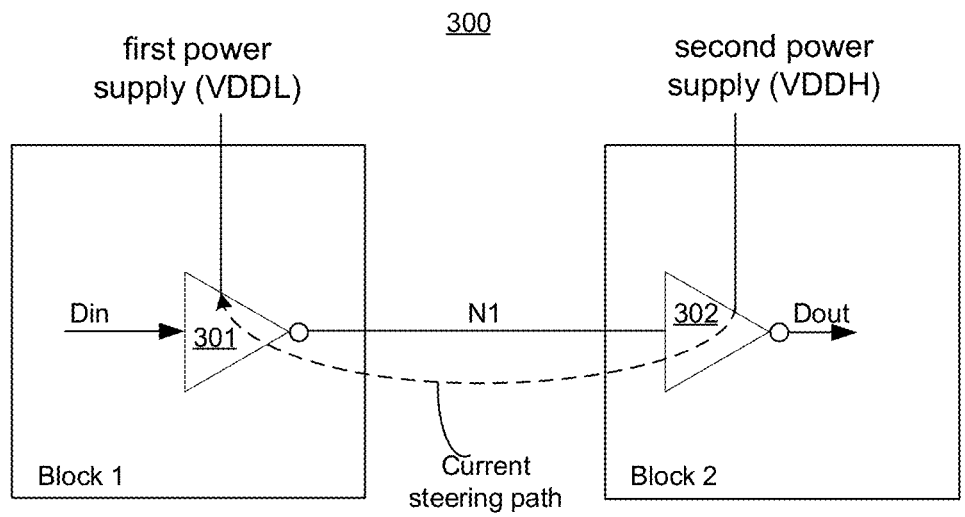
FIG. 3 illustrates a high level diagram of a current steering level-shifter, according to some embodiments of the disclosure.

FIG. 3 illustrates high level diagram 300 of a current steering level-shifter, according to some embodiments of the disclosure. It is pointed out that those elements of FIG. 3 having the same reference numbers (or names) as the elements of any other figure can operate or function in any manner similar to that described, but are not limited to such.

Continuing with the example of FIG. 2, high level diagram 300 also shows two power supply domains illustrated by Block 1 and Block 2, respectively. Referring back to FIG. 3, Block 1 is powered by the first power supply (VDDL) while Block 2 is powered by the second power supply (VDDH). In this example, Block 1 includes a driver 301 that receives an input Din and provides it as an output on node N1 to receiver 302. Here, labels for nodes and signals are interchangeably used. For example, "N1" may refer to node N1 or signal N1 depending on the context of the sentence.

In some embodiments, receiver 302 is a current steering level-shifter that mitigates the routing limitations of traditional level-shifters such as dual supply level-shifters. In some embodiments, current steering level-shifter 301 steers current from the second power supply node providing VDDH to the first power supply node providing VDDL. In some embodiments, the steered current is used by a voltage regulator or a power-gating transistor on the VDDL power domain to reuse power, and thus reducing overall power production by the voltage regulator or power-gating transistor on the VDDL power domain.

Figure 4A:
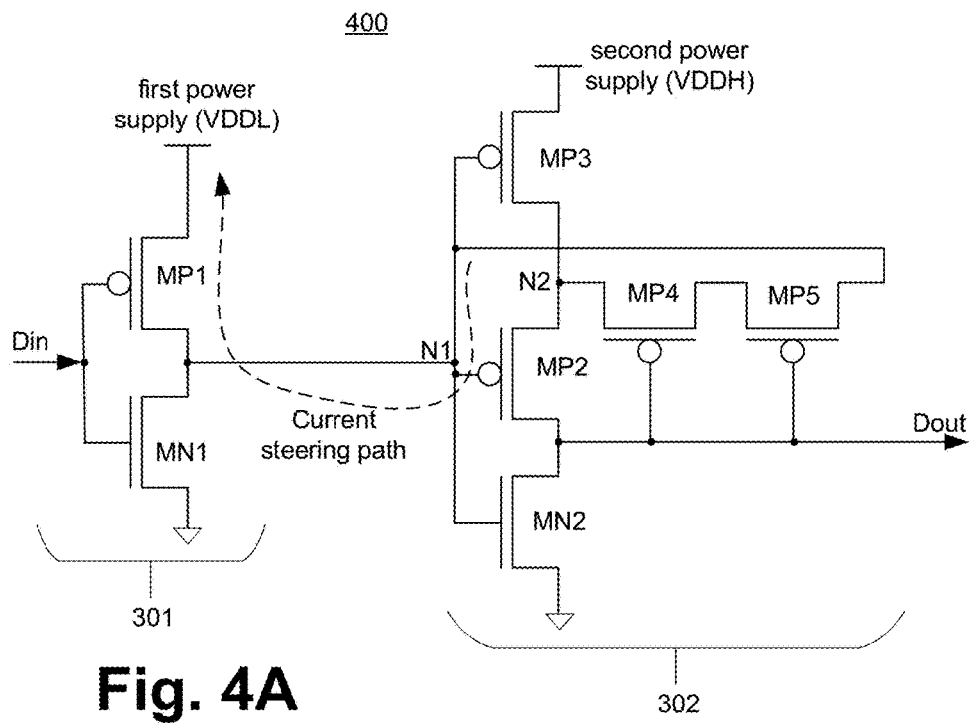
FIG. 4A illustrates a transistor level diagram of a current steering level-shifter, according to some embodiments of the disclosure.

FIG. 4A illustrates transistor level diagram 400 of a current steering level-shifter, according to some embodiments of the disclosure. It is pointed out that those elements of FIG. 4A having the same reference numbers (or names) as the elements of any other figure can operate or function in any manner similar to that described, but are not limited to such.

In some embodiments, transistor level diagram 400 includes driver 301 operating on VDDL, and current steering level-shifter 302. In some embodiments, driver 301 is a simple inverter having a p-type transistor MP1 coupled in series to an n-type transistor MN1, where driver 301 drives Din as an inverted version on node N1. While various embodiments illustrate driver 301 as an inverter, any driver circuit may be used. For example, driver 301 may be a stacked inverter to reduce standby leakage through driver 301.

In some embodiments, current steering level-shifter 302 comprises p-type transistors MP2, MP3, MP4, and MP5; and n-type transistor MN2 coupled together as shown. Gate terminals of transistors MP2, MP3, and MN2 are coupled to node N1 and receive the signal to be level-shifted from the VDDL power domain to the VDDH power domain. In some embodiments, the common node N2 coupling transistors MP1 and MP3 provides a virtual supply to transistors MP2 and MN2. In some embodiments, the common node Dout coupling transistors MP2 and MN2 also couples the gate terminals of transistors MP4 and MP5, where transistors MP4 and MP5 are coupled in series to node N2 such that a source/drain terminal of transistor MP5 is coupled to node N1. In some embodiments, the pull-up path to the higher supply voltage (VDDH) is stacked as realized by transistors MP2 and MP3, and a current steering path (i.e., transistors MP4 to MP5) is added connecting to the nodes N1 and N2.

Figure 4B:
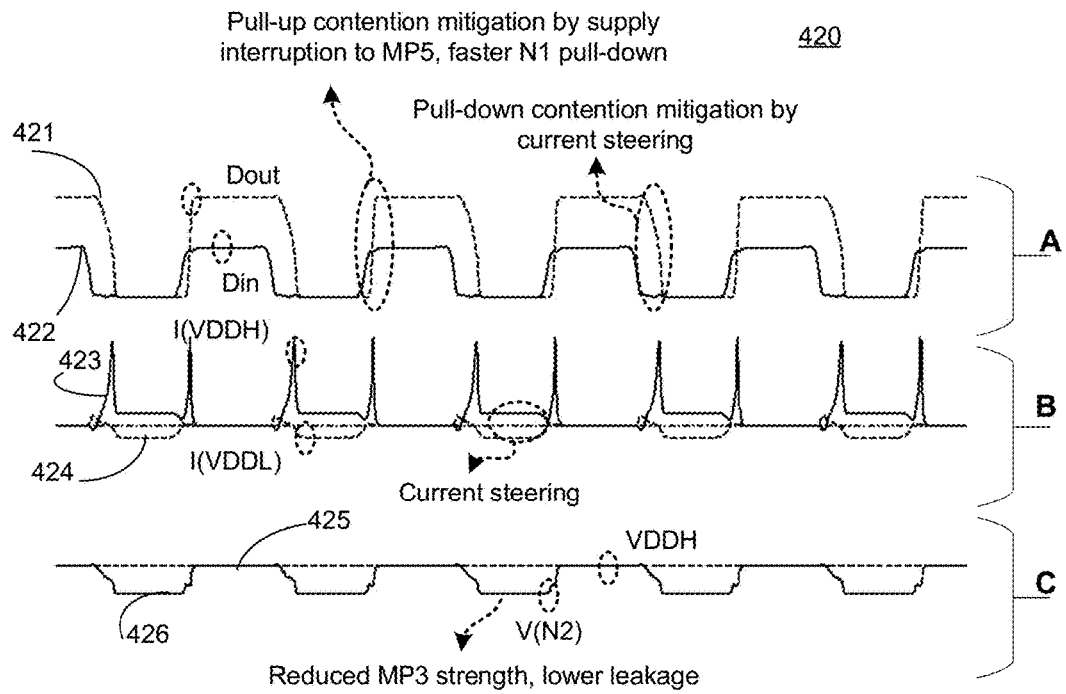
FIG. 4B illustrates operational waveforms demonstrating current steering from a high power supply node to a low power supply node.

FIG. 4B illustrates operational waveforms 420 for circuit of FIG. 4A demonstrating current steering from a high power supply node to a low power supply node. It is pointed out that those elements of FIG. 4B having the same reference numbers (or names) as the elements of any other figure can operate or function in any manner similar to that described, but are not limited to such. Here, x-axis is time and y-axis is voltage for waveforms A and B, while y-axis is current for waveform B.

Waveform A shows voltage waveform 421 of Dout and voltage waveform 422 of Din. Waveform B shows current waveform 423 through the power supply node VDDH and current waveform 424 through the power supply node VDDL. Waveform C shows voltage waveform 425 of VDDH and voltage waveform 426 as observed on node N2.

When Din swings low and voltage on node N1 is raised high to VDDL, there is a static current through transistors MP2 and MP3. The gate terminals of the current steering path transistors MP4 and MP5 are connected to Dout, and as Dout potential reduces, the current steering path turns on to redirect the static current in transistor MP3 to the input node N1 instead of dissipating it to the ground node.

In some embodiments, the current steering path reduces the potential of node N2, and thus the gate-to-source voltage (Vgs) across transistor MP2 is reduced along with the static leakage to the ground node. In some embodiments, a weakened transistor MP2 also mitigates the pull-down contention for Dout as indicated on waveform A. On the other hand, when Din is raised high, transistors MP2 and MP3 charge the node Dout to VDDH, and the current steering path is turned off. In some embodiments, a stacked configuration of the current steering path mitigates contention between transistor MN1 and the current steering path (i.e., path through transistors MP4 to MP5) when Din is being raised higher as indicated by waveform A.

Figure 5:
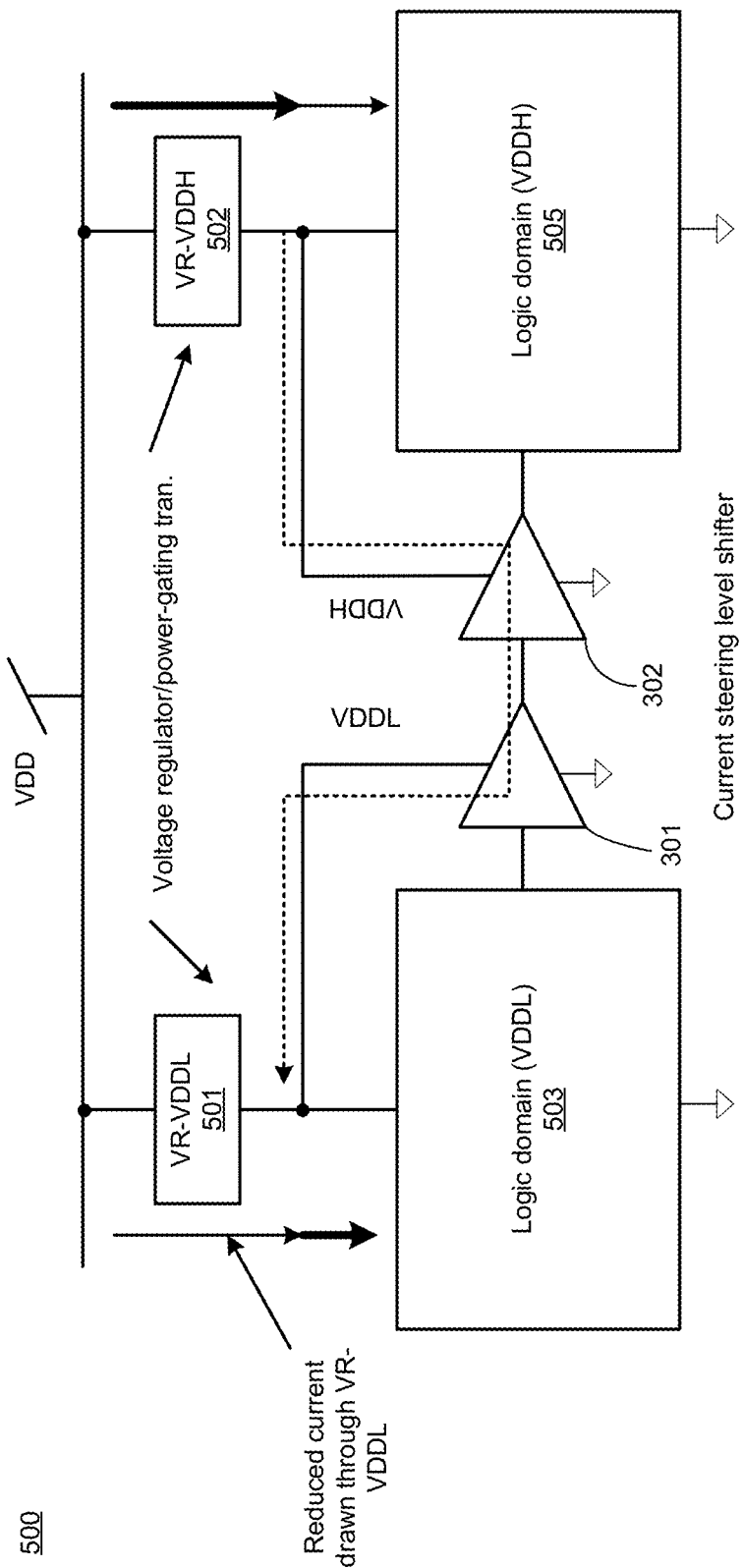
FIG. 5 illustrates system level power management using a current steering level-shifter, according to some embodiments of the disclosure.

FIG. 5 illustrates system level power management 500 using a current steering level-shifter, according to some embodiments of the disclosure. It is pointed out that those elements of FIG. 5 having the same reference numbers (or names) as the elements of any other figure can operate or function in any manner similar to that described, but are not limited to such.

In some embodiments, current steering level-shifter 302 redirects current from a higher voltage supply domain (i.e., VDDH) to a lower voltage supply domain (i.e., VDDL). In response, the current drawn from a voltage regulator providing VDDL is reduced. In some embodiments, current steering level-shifter 302 conserves power as compared to known level-shifters by avoiding current dissipation to the ground node.

In some embodiments, system level power management 500 comprises VR to generate VDDL (i.e., VR-VDDL 501), VR to generate VDDH (i.e., VR-VDDH 502), Logic Domain 503 that operates on VDDL, Logic Domain 504 that operates on VDDH, driver 301, and current steering level-shifter 302. Here, driver 301 operates on VDDL and current steering level-shifter 302 operates on VDDH.

In some embodiments, the steered current from VR-VDDH 502 through current steering level-shifter 302 is utilized by VR-VDDL 501, where a lesser current is now drawn through VR-VDDL 501 from the global supply voltage VDD. Here, the thin arrow indicates reduced current drawn while the thick arrow before or after the thin arrow indicates larger current drawn. Therefore, unlike in inverter and p-stacked inverter topologies as described with reference to FIGS. 7A-B, by avoiding static current dissipation to ground, current steering level-shifter 302 conserves power from a system level perspective while achieving smaller delay/area overheads.

Figure 6A:
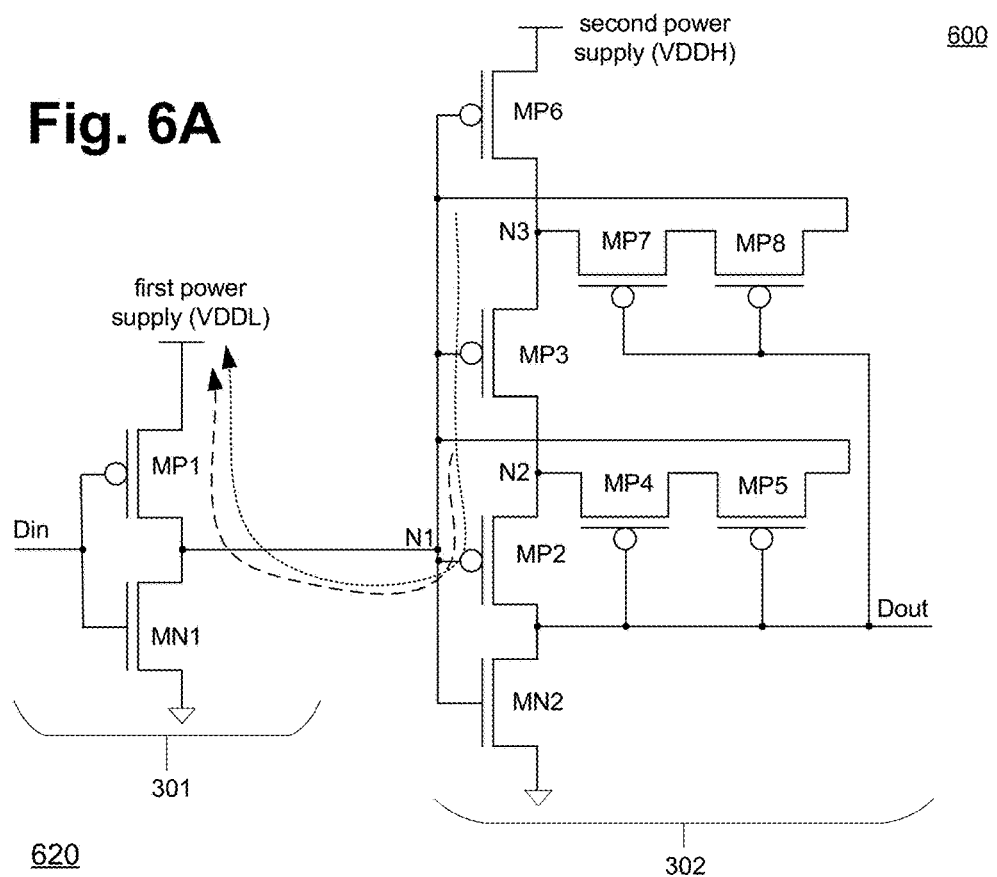
FIG. 6A illustrates a transistor level diagram of a current steering level-shifter, according to some embodiments of the disclosure.

FIG. 6A illustrates transistor level diagram 600 of a current steering level-shifter, according to some embodiments of the disclosure. It is pointed out that those elements of FIG. 6A having the same reference numbers (or names) as the elements of any other figure can operate or function in any manner similar to that described, but are not limited to such.

Compared to the embodiments of FIG. 4A, transistor level diagram 600 of FIG. 6A is a stacked current steering level-shifter 302. In some embodiments, stacked current steering level-shifter 302 of FIG. 6A exhibits a much lower current dissipation to ground than that exhibited by current steering level-shifter 302 of FIG. 4A. So as not to obscure the embodiment of FIG. 6A, differences between FIG. 4A and FIG. 6A are described.

In some embodiments, current steering level-shifter comprises p-type transistors MP6, MP7, and MP8 such that transistor MP6 is coupled in series to transistor MP3, and transistors MP7 and MP8 are coupled in series together. In some embodiments, source/drain terminal of transistor MP7 is coupled to node N3 (which is a common node coupling transistor MP6 to transistor MP3). In some embodiments, source/drain terminal of transistor MP8 is coupled to node N1 just like the source/drain of transistor MP5 is coupled to node N1. In some embodiments, gate terminals of transistor MP7 and transistor MP8 are coupled to Dout. In some embodiments, an additional current steering path is provided through transistors MP7 and MP8 as shown by the tighter dotted line curve extending from the gate terminal of transistor MP6 to the first power supply node (i.e., the node providing VDDL).

For current steering level-shifter 302 of FIG. 4A, when the supply voltage difference (i.e., VDDH-VDDL) is large enough, the potential of node N2 can be significantly higher than VDDL, and induces a higher static current to ground. In some embodiments, current steering level-shifter 302 of FIG. 6A suppresses ground leakage even at higher differences between supply voltages VDDH and VDDL.

In some embodiments, an additional current steering stack (i.e., transistors MP6 through MP8) is added in current steering level-shifter 302 of FIG. 6A. In some embodiments, when Din swings low (from high) and Dout potential reduces, the additional current steering path provided by the path through transistors MP7 and MP8 steers current from transistor MP6 and reduces the potential of node N3.

By reducing the potential of node N3, the source-to-gate voltage (Vgs) of transistor MP3 reduces and so the strength of transistor MP3 reduces, according to some embodiments. In such a case, the current steering path through transistors MP4 and MP5 can collapse the potential of the node N2 to equivalent to VDDL, according to some embodiments. Therefore, the leakage dissipation to ground through transistor MP2 is suppressed with the assistance of an additional current steering path, according to some embodiments.

Figure 6B:
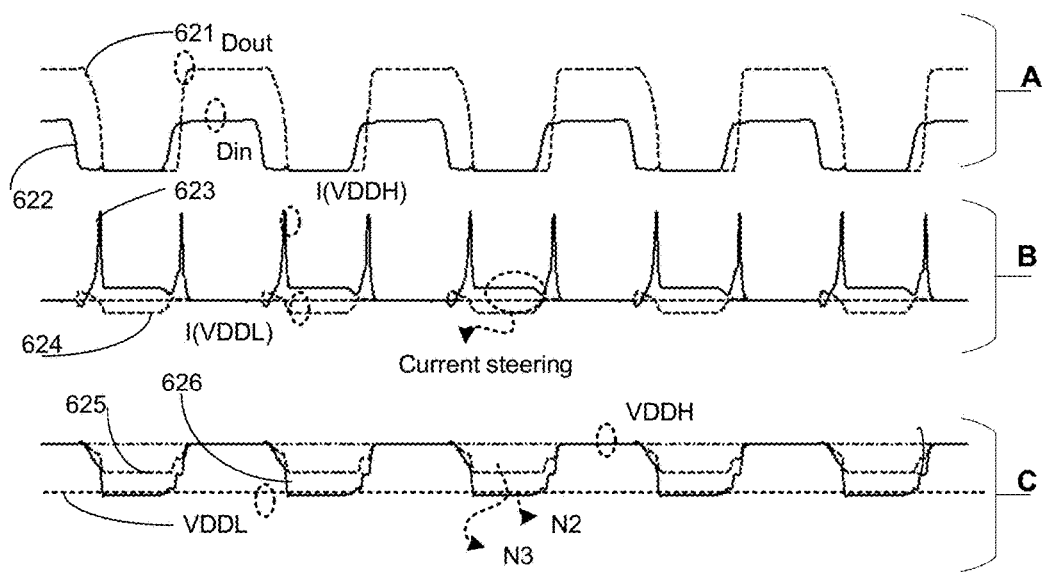
FIG. 6B illustrates operational waveforms demonstrating current steering from a high power supply node to a low power supply node.

FIG. 6B illustrates operational waveforms 620 demonstrating current steering from a high power supply node to a low power supply node. It is pointed out that those elements of FIG. 6B having the same reference numbers (or names) as the elements of any other figure can operate or function in any manner similar to that described, but are not limited to such. Here, x-axis is time and y-axis is voltage for waveforms A and B while y-axis is current for waveform B.

Waveform A shows voltage waveform 621 of Dout and voltage waveform 622 of Din. Waveform B shows current waveform 623 through the power supply node VDDH and current waveform 624 through the power supply node VDDL. Waveform C shows voltage waveform 625 as observed on node N2, and voltage waveform 626 as observed on node N3. In Waveform C, VDDH and VDDL are illustrated for reference purposes.

Here, a much greater reduction in node N2 potential is observed as compared to the node N3 potential. The potential of node N2 is equivalent to VDDL, hence, static current in stacked current steering level-shifter 302 of FIG. 6A is significantly suppressed compared to the current steering level-shifter 301 of FIG. 4A. In some embodiments, with the additional current steering stack, stacked current steering level-shifter 301 of FIG. 6A may have a higher input capacitance (which may translate to a larger silicon area) and a slower signal transition as compared to current steering level-shifter 301 of FIG. 4A.

To appreciate various advantages of current steering level-shifters 302 of FIG. 4A and FIG. 6A, delay and leakage reduction numbers are compared with those of other level-shifters described with reference to FIGS. 7A-D.

FIG. 7A illustrates inverter chain 700. Here, the driver on VDDL power domain having transistors MP1 and MN1 (coupled together as an inverter) drives input Din to the receiver on operating on the VDDH power domain, where the receiver is an inverter having transistors MP2 and MN2. While the inverter chain (i.e., the receiver inverter) is a compact high speed receiver, it suffers from static leakage power consumption.

FIG. 7B illustrates p-stacked inverter chain 720. Here, the driver is operating on the VDDL power domain and may be the same as driver of inverter chain 700. The receiver operating on the VDDH power domain is a p-stacked inverter with an additional p-type transistor MP3 (compared to the receiver of inverter change 700) coupled in series to transistor MP2 as shown. While p-stacked inverter chain 720 offers a compact design with high speed, it also suffers from static leakage power consumption.

FIG. 7C illustrates supply collapse level-shifter 730. In some embodiments, supply collapse level-shifter 730 receives input Din from a logic operating on the VDDL power domain. In some embodiments, supply collapse level-shifter 730 comprises a diode connected circuit (or transistor) MN2 coupled in parallel to transistor MP2 (which is driven by Dout) to generate a virtual supply for the transistor MP1. Transistor MP1 is coupled in series with transistor MN1 and inverts input Din to provide the inverted signal to the inverter having transistors MP4/MN3. The output of inverter with transistors MP4/MN3 is Dout. While supply collapse level-shifter 730 offers a compact design with less leakage, it has high propagation delay from the input node Din to the output node Dout.

FIG. 7D illustrates interruptible supply split output level-shifter 740. This is a traditional level-shifter having a cross-coupled structure consisting of transistors MN1, MP1, MP2, MN2, MP3, and MP4 coupled together as shown, and a driver consisting of transistors MP5 and MN3 coupled together as shown. The interruptible supply split output level-shifter 740 includes an inverter inv operating on the first power supply VDDL as shown. While interruptible supply split output level-shifter 740 offers high speed and low leakage, it consumes a large area and also requires dual supplies (i.e., VDDL and VDDH power supplies).

Figures 7E, 7F:
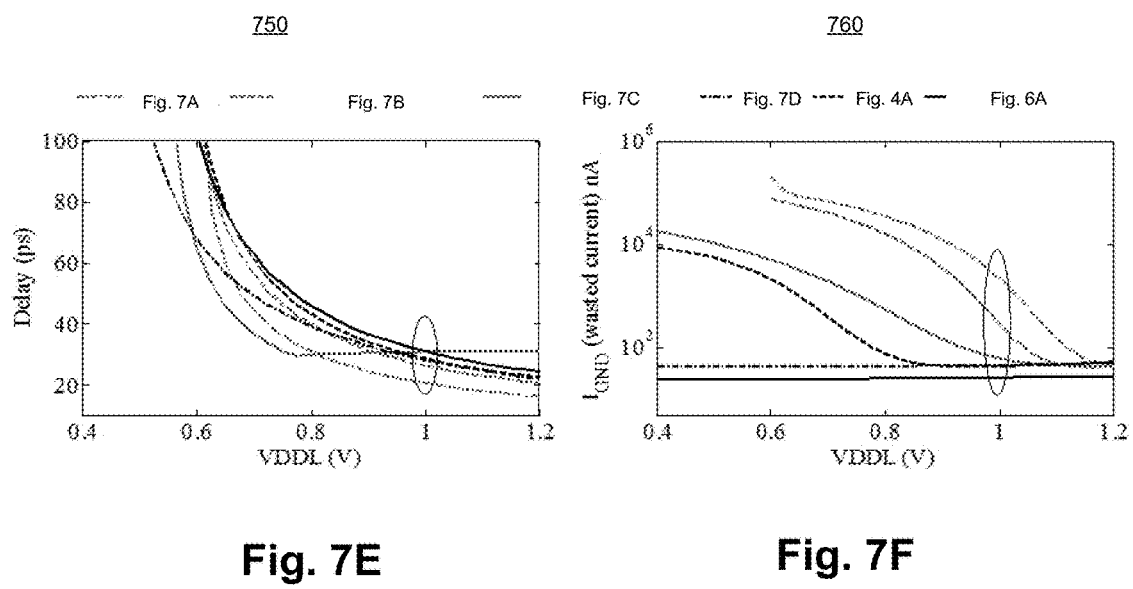
FIG. 7E illustrates a plot comparing delays of circuits in FIGS. 7A-D and current steering level-shifters of FIG. 4A and FIG. 6A.
FIG. 7F illustrates a plot comparing leakage power of circuits in FIGS. 7A-D and current steering level-shifters of FIG. 4A and FIG. 6A.

FIG. 7E illustrates plot 750 comparing the propagation delays of circuits in FIGS. 7A-D and the current steering level-shifters of FIG. 4A and FIG. 6A. Propagation delay here is the delay measured from 50% of the signal swing level of the input Din to 50% of the signal swing level of the output Dout. It is pointed out that those elements of FIG. 7E having the same reference numbers (or names) as the elements of any other figure can operate or function in any manner similar to that described, but are not limited to such. Here, x-axis is VDDL in Volts (V) and y-axis is Delay in picoseconds (ps).

Considering VDDH=1.2V, propagation delay of various designs illustrated by FIGS. 7A-D and the current steering level-shifters of FIGS. 4A and 6A are compared at varying VDDL voltage levels. In this example, simulations are shown for a typical process corner with temperature T=50° C. The delay in various designs increases when the VDDL voltage level is lowered. Due to a higher number of transistors and the associated capacitance than that disclosed by FIG. 7A, the current steering level-shifter of FIG. 4A incurs 1.4 times more delay overhead at VDDL=1V as compared to the delay overhead by the inverter chain of FIG. 7A.

Due to an additional stack and even higher node capacitance than an inverter, the stacked current steering level-shifter incurs 1.5 times more delay at VDDL=1V as compared to the delay overhead by inverter chain of FIG. 7A. In some cases, the delay in the current steering level-shifter of FIG. 4A and the stacked current steering level-shifter of FIG. 6A is equivalent to the delay in other level-shifters (i.e., those illustrated by FIGS. 7A-C). The supply collapse level shifter of FIG. 7D has a higher delay (i.e., dominated by high-to-low Dout delay) than the delay of other designs under smaller VDD mismatches, and becomes delay efficient over a window of higher VDD mismatches.

FIG. 7F illustrates plot 760 comparing the leakage power of circuits in FIGS. 7A-D and the current steering level-shifters of FIG. 4A and FIG. 6A. It is pointed out that those elements of FIG. 7F having the same reference numbers (or names) as the elements of any other figure can operate or function in any manner similar to that described, but are not limited to such. Here, x-axis is VDDL in Volts (V) and y-axis is current on the ground node (i.e., $I_{GND}$) in nano amperes (nA). The current flowing to the ground node is the wasted current, which is the leakage current.

The leakage current of various designs (i.e., current flowing to the ground node) is compared at varying VDDL voltage levels, at typical process corner, VDDH=1.2V, and T=50° C. Here, the current steering level-shifter of FIG. 4A and the stacked current steering level-shifter of FIG. 6A save significant leakage dissipation as compared to the level shifters of FIGS. 7A-D. Here, leakage current is demonstrated as an average of the Din=0 and Din=1 cases.

At ΔVDDL=200 mV, the current steering level-shifter of FIG. 4A has 50 times lowers static current than the static current of the inverter chain of FIG. 7A. For the same case, the stacked current steering level-shifter of FIG. 6A has 80 times lower static current than the static current of inverter chain of FIG. 7A. The current steering level-shifter of FIG. 4A also has a lower static current than the static current of the p-stacked inverter chain of FIG. 7B and the supply collapse level-shifter of FIG. 7C.

While the static current of the current steering level-shifter of FIG. 4A increases at VDDL less than 0.8V, the stacked current steering level-shifter of FIG. 6A continues to show very low static current even at lower VDDL voltage levels (e.g., VDDL=0.4V). In some embodiments, the stacked current steering level-shifter of FIG. 6A has the lowest wasted current among all the discussed designs. In some embodiments, the static current dissipation in the stacked current steering level-shifter of FIG. 6A is even lower than the sub-threshold leakage dissipation in the level-shifter of FIG. 7D. In some embodiments, the stacked current steering level-shifter of FIG. 6A achieves much lower leakage power by operating transistors in the leakage path with both lower Vgs as well as lower Vds than the leakage power of any of the designs of FIGS. 7A-D.

Figure 8:
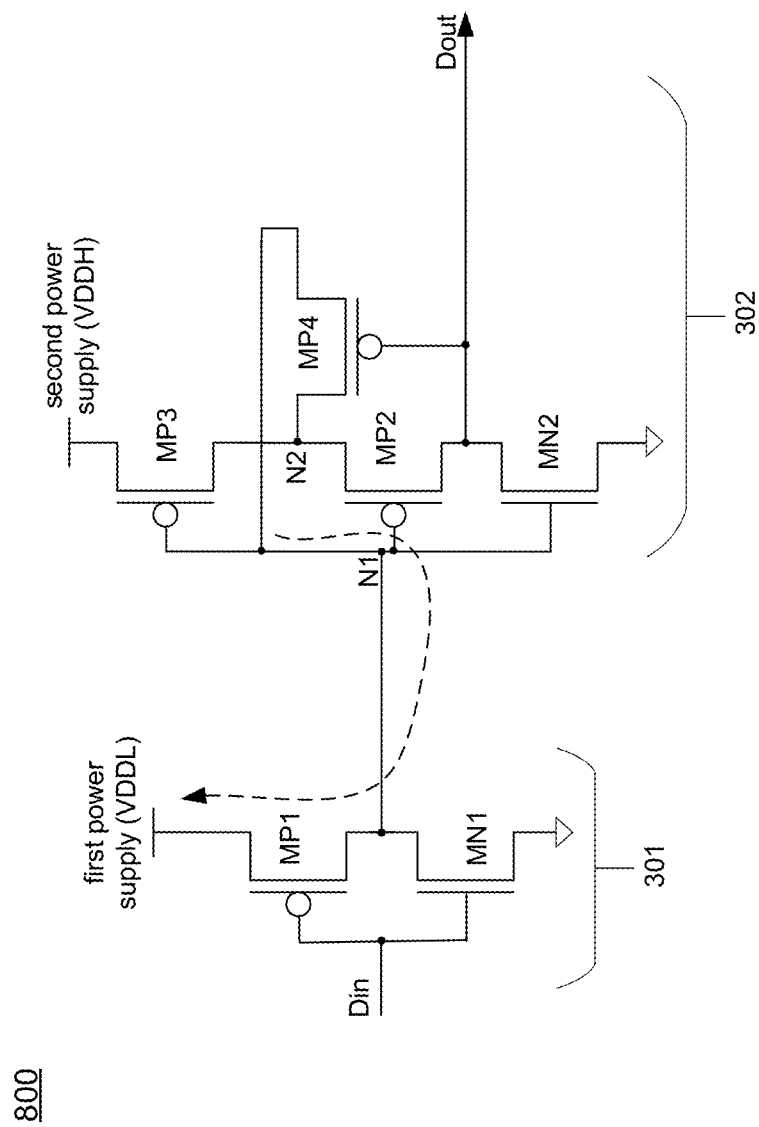
FIG. 8 illustrates a transistor level diagram of a current steering level-shifter, according to some embodiments of the disclosure.

FIG. 8 illustrates transistor level diagram 800 of a current steering level-shifter, according to some embodiments of the disclosure. It is pointed out that those elements of FIG. 8 having the same reference numbers (or names) as the elements of any other figure can operate or function in any manner similar to that described, but are not limited to such. So as not to obscure the embodiment of FIG. 8, differences between FIG. 4A and FIG. 8 are described. In some embodiments, the transistor count of the current steering level-shifter of FIG. 8 is reduced over the transistor count of the current steering level-shifter of FIG. 4A by removing transistor MP5 and coupling the source/drain terminal of transistor MP4 to node N1. In this case, the current steering path passes through transistor MP4.

Figure 9:
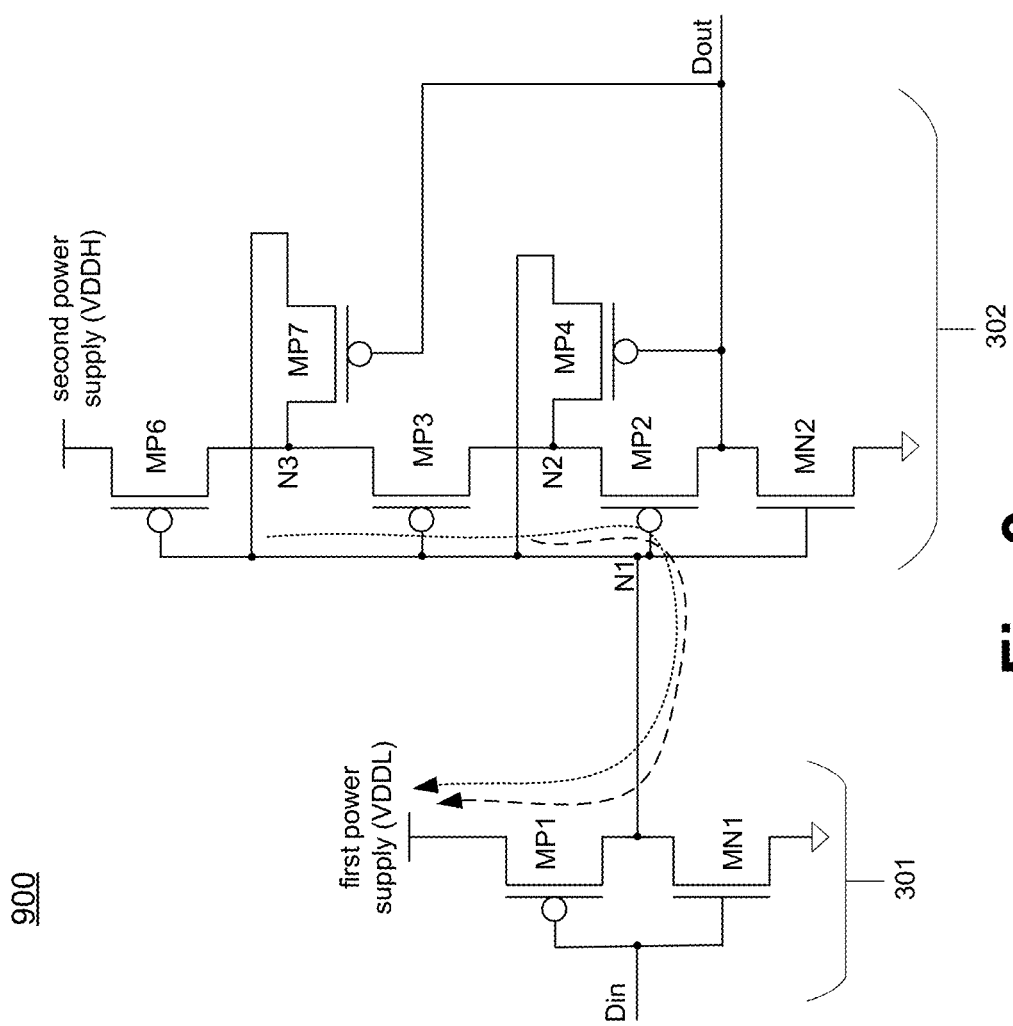
FIG. 9 illustrates a transistor level diagram of a current steering level-shifter, according to some embodiments of the disclosure.

FIG. 9 illustrates transistor level diagram 900 of a current steering level-shifter, according to some embodiments of the disclosure. It is pointed out that those elements of FIG. 9 having the same reference numbers (or names) as the elements of any other figure can operate or function in any manner similar to that described, but are not limited to such. So as not to obscure the embodiment of FIG. 9, differences between FIG. 6A and FIG. 9 are described.

In some embodiments, the transistor count of the current steering level-shifter of FIG. 9 is reduced over the transistor count of the current steering level-shifter of FIG. 6A by removing transistors MP5 and MP8. In some embodiments, the source/drain terminal of the transistor MP4 is coupled to node N1. In some embodiments, the source/drain terminal of the transistor MP7 is coupled to node N1. In this case, the current steering path passes through transistors MP4 and MP7.

Figure 10A:
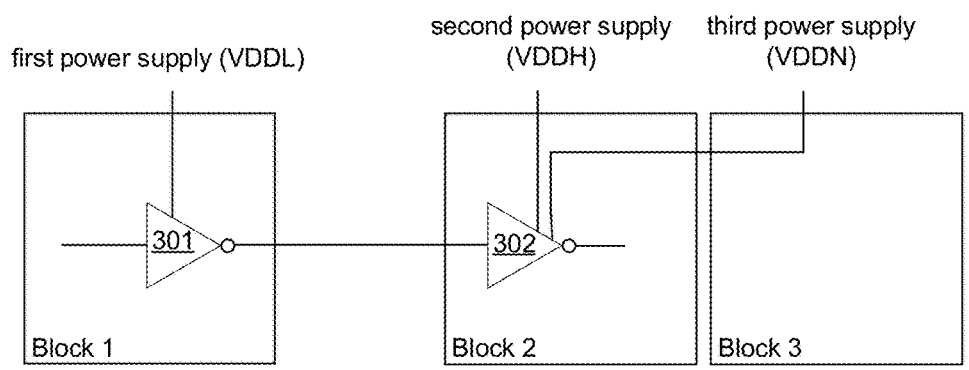
FIG. 10A illustrates a system level diagram of a current steering level-shifter, according to some embodiments of the disclosure.

FIG. 10A illustrates system level diagram 1000 using a current steering level-shifter, according to some embodiments of the disclosure. It is pointed out that those elements of FIG. 10A having the same reference numbers (or names) as the elements of any other figure can operate or function in any manner similar to that described, but are not limited to such. FIG. 10A is described with reference to FIG. 3.

In some cases, $V_{MIN}$ in for the current steering level-shifters of FIG. 4A and FIG. 6A may be limited due to a contention path between transistor MN1 and the current steering path. In some embodiments, the contention path is eliminated by using another current steering path to a neighboring supply rail (also referred to as the third power supply rail). In cases where there is a neighboring supply rail (i.e., neighboring to the second power supply rail VDDH), current can be steered from level-shifter 302 to the neighboring supply VDDN, where the voltage level of VDDN is less than or equal to the voltage level of VDDL.

Figure 10B:
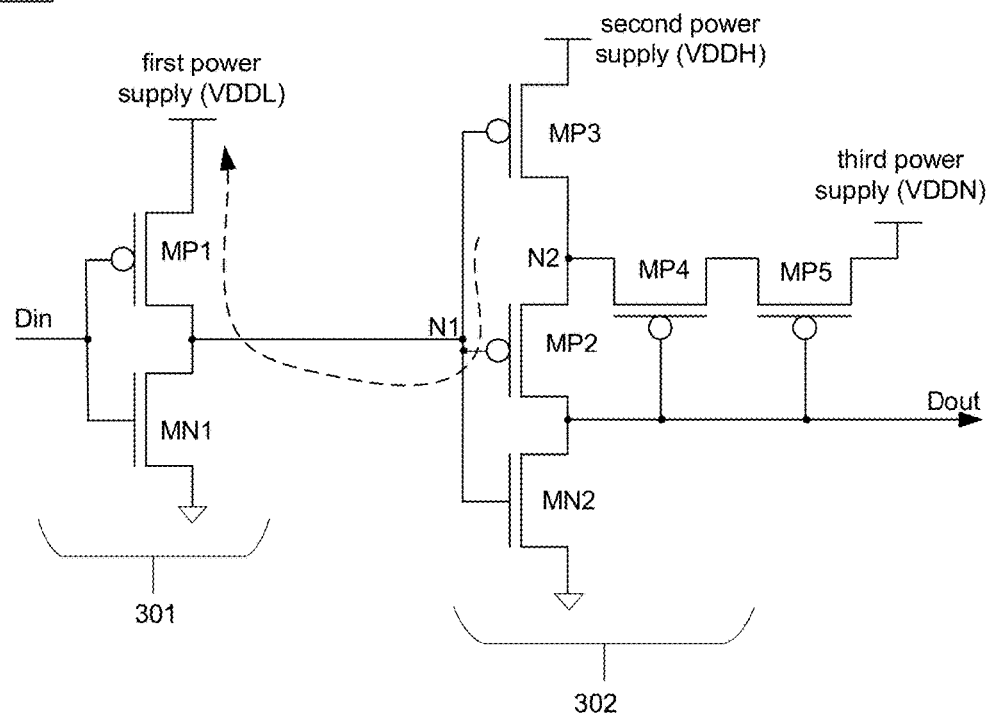
FIG. 10B illustrates a transistor level diagram of a current steering level-shifter, according to some embodiments of the disclosure.

FIG. 10B illustrates transistor level diagram 1020 of a current steering level-shifter, according to some embodiments of the disclosure. It is pointed out that those elements of FIG. 10A having the same reference numbers (or names) as the elements of any other figure can operate or function in any manner similar to that described, but are not limited to such. So as not to obscure the embodiment of FIG. 10B, differences between FIG. 4A and FIG. 10B are described.

In some embodiments, instead of coupling the source/drain terminal of the transistor MP5 to node N1, the source/drain terminal is coupled to the neighboring power supply node (or the third power supply node) VDDN, where the voltage level of VDDN is less than or equal to the voltage level of VDDL. Here, the static current from transistor MP3 is directed to the VDDN supply rail, which achieves similar system level power saving while eliminating contention between the current steering path and transistor MN1.

The embodiment of FIG. 10B can be extended to the stacked current steering level-shifter described with reference to FIG. 6A, according to some embodiments. For example, in some embodiments, instead of coupling the source/drain terminal of transistor MP5 to node N1, the source/drain terminal is coupled to the neighboring power supply node (or third the power supply node) VDDN, and instead of coupling the source/drain terminal of transistor MP8 to node N1, the source/drain terminal is coupled to the neighboring power supply node VDDN. Here, "neighboring" power supply node generally refers to the power supply node which is in close proximity to another power supply node. For example, neighboring power supply VDDH is closer to the second power supply VDDH than to the first power supply VDDL.

The embodiment of FIG. 10B can be extended to the current steering level-shifter described with reference to FIG. 8, according to some embodiments. For example, in some embodiments, instead of coupling the source/drain terminal of transistor MP4 to node N1, it is coupled to the neighboring power supply node (or the third power supply node) VDDN.

The embodiment of FIG. 10B can be extended to a stacked current steering level-shifter described with reference to FIG. 9, according to some embodiments. For example, in some embodiments, instead of coupling the source/drain terminal of transistor MP4 to node N1, the source/drain terminal of transistor MP4 is coupled to the neighboring power supply node (or the third power supply node) VDDN, and instead of coupling the source/drain terminal of transistor MP7 to node N1, it is coupled to the neighboring power supply node VDDN.

Figure 11:
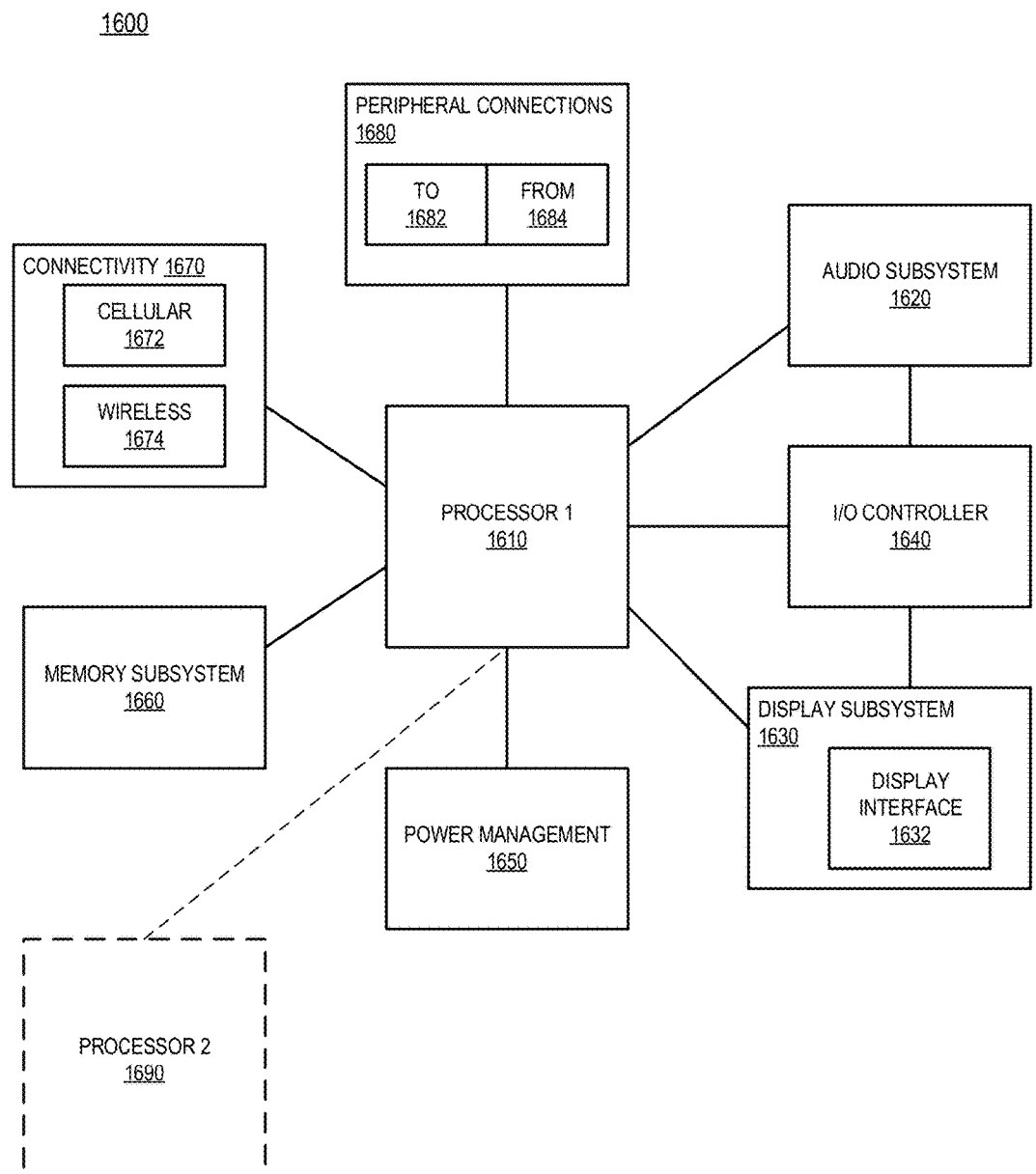
FIG. 11 illustrates a smart device or a computer system or a SoC (System-on-Chip) with a current steering level-shifter, according to some embodiments.

FIG. 11 illustrates a smart device or a computer system or a SoC with a current steering level-shifter, according to some embodiments. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with a current steering level-shifter, according to some embodiments discussed. Other blocks of the computing device 1600 may also include a current steering level-shifter of some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 includes display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 includes I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 includes peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first power supply node to provide a first power supply; a second power supply node to provide a second power supply; a driver to operate on the first power supply, the driver to generate an output; and a receiver to operate on the second power supply, the receiver to receive the output from the driver and to generate a level-shifted output such that the receiver is operable to steer current from the second power supply to the first power supply. In some embodiments, a voltage level of the second power supply is higher than a voltage level of the first power supply.

In some embodiments, the receiver comprises a first p-type transistor coupled to the second power supply node, and wherein the first p-type transistor to receive the output of the driver. In some embodiments, the receiver comprises a second p-type transistor coupled in series with the first p-type transistor, wherein the second p-type transistor to receive the output of the driver. In some embodiments, the receiver comprises a third p-type transistor coupled to a source terminal of the second p-type transistor such that a gate terminal of the third p-type transistor is coupled to a drain terminal of the second p-type transistor.

In some embodiments, a source/drain terminal of the third p-type transistor is coupled to the gate terminal of the first p-type transistor. In some embodiments, the receiver comprises a fourth p-type transistor coupled in series with the third p-type transistor such that a source/drain terminal of the fourth p-type transistor is coupled to the gate terminal of the first p-type transistor. In some embodiments, the receiver comprises a first n-type transistor coupled in series with the second p-type transistor, the first n-type transistor having a gate terminal to receive the output from the driver. In some embodiments, the driver comprises an inverter that receives an input and generates the output.

In another example, a system is provided which comprises: a memory; a processor coupled to the memory, the processor having a level-shifter which includes an apparatus according to the apparatus described above; and a wireless interface for allowing the processor to communicate with another device. In some embodiments, the processor comprises: a first voltage regulator coupled to the first power supply node, the first voltage regulator to generate the first power supply. In some embodiments, the processor comprises: a second voltage regulator coupled to the second power supply node, the second voltage regulator to generate the second power supply. In some embodiments, the second VR to generate a voltage level of the second power supply to be higher than a voltage level of the first power supply.

In another example, an apparatus is provided which comprises: a first power supply node to provide a first power supply; a second power supply node to provide a second power supply; a third power supply node to provide a third power supply; a driver to operate on the first power supply, the driver to generate an output; and a receiver to operate on the second power supply, the receiver to receive the output from the driver and to generate a level-shifted output such that the receiver is operable to steer current from the second power supply node to the third power supply node.

In some embodiments, a voltage level of the third power supply is less than or equal to a voltage level of the first power supply. In some embodiments, a voltage level of the first power supply is less than a voltage level of the second power supply. In some embodiments, the receiver comprises: a first p-type transistor coupled to the second power supply node, the first p-type transistor to receive the output of the driver, and a second p-type transistor coupled in series with the first p-type transistor, the second p-type transistor to receive the output of the driver.

In some embodiments, the receiver comprises: a third p-type transistor coupled to a source terminal of the second p-type transistor such that a gate terminal of the third p-type transistor is coupled to a drain terminal of the second p-type transistor, and wherein a source/drain terminal of the third p-type transistor is coupled to the gate terminal of the first p-type transistor. In some embodiments, the receiver comprises a fourth p-type transistor coupled in series with the third type transistor such that a source/drain terminal of the fourth p-type transistor is coupled to the third power supply node.

In another example, a system is provided which comprises: a memory; a processor coupled to the memory, the processor having a level-shifter which includes an apparatus according to the apparatus described above; and a wireless interface for allowing the processor to communicate with another device. In some embodiments, the processor comprises: a first voltage regulator coupled to the first power supply node, the first voltage regulator to generate the first power supply. In some embodiments, the processor comprises: a second voltage regulator coupled to the second power supply node, the second voltage regulator to generate the second power supply. In some embodiments, the second VR to generate a voltage level of the second power supply to be higher than a voltage level of the first power supply.

In another example, a method is provided which comprises: providing a first power supply to a first power supply node; providing a second power supply to a second power supply node; driving an output by a driver operating on the first power supply; receiving, by a receiver operating on the second power supply, the output from the driver; and generating a level-shifted output such that the receiver is operable to steer current from the second power supply to the first power supply.

In some embodiments, a voltage level of the second power supply is higher than a voltage level of the first power supply. In some embodiments, the method comprises: coupling a first p-type transistor of the receiver to the second power supply node, and receiving by the first p-type transistor the output of the driver. In some embodiments, the method comprises: coupling a second p-type transistor in series with the first p-type transistor, wherein the second p-type transistor to receive the output of the driver. In some embodiments, the method comprises: coupling a third p-type transistor to a source terminal of the second p-type transistor such that a gate terminal of the third p-type transistor is coupled to a drain terminal of the second p-type transistor.

In some embodiments, the method comprises: coupling a source/drain terminal of the third p-type transistor to the gate terminal of the first p-type transistor. In some embodiments, the method comprises: coupling a fourth p-type transistor in series with the third type transistor such that a source/drain terminal of the fourth p-type transistor is coupled to the gate terminal of the first p-type transistor. In some embodiments, the method comprises: coupling a first n-type transistor in series with the second p-type transistor, the first n-type transistor having a gate terminal to receive the output from the driver.

In some embodiments, an apparatus is provided which comprises: means for providing a first power supply to a first power supply node; means for providing a second power supply to a second power supply node; means for driving an output by a driver operating on the first power supply, means for receiving, by a receiver operating on the second power supply, the output from the driver, and means for generating a level-shifted output such that the receiver is operable to steer current from the second power supply to the first power supply.

In some embodiments, a voltage level of the second power supply is higher than a voltage level of the first power supply. In some embodiments, the apparatus comprises: means for coupling a first p-type transistor of the receiver to the second power supply node, and means for receiving by the first p-type transistor the output of the driver.

In some embodiments, the apparatus comprises: means for coupling a second p-type transistor in series with the first p-type transistor, wherein the second p-type transistor to receive the output of the driver. In some embodiments, the apparatus comprises: means for coupling a third p-type transistor to a source terminal of the second p-type transistor such that a gate terminal of the third p-type transistor is coupled to a drain terminal of the second p-type transistor.

In some embodiments, the apparatus comprises: means for coupling a source/drain terminal of the third p-type transistor to the gate terminal of the first p-type transistor. In some embodiments, the apparatus comprises: means for coupling a fourth p-type transistor in series with the third type transistor such that a source/drain terminal of the fourth p-type transistor is coupled to the gate terminal of the first p-type transistor. In some embodiments, the apparatus comprises: means for coupling a first n-type transistor in series with the second p-type transistor, the first n-type transistor having a gate terminal to receive the output from the driver.

In another example, a system is provided which comprises: a memory; a processor coupled to the memory, the processor having a level-shifter which includes an apparatus according to the apparatus described above; and a wireless interface for allowing the processor to communicate with another device. In some embodiments, the processor comprises: a first voltage regulator coupled to the first power supply node, the first voltage regulator to generate the first power supply. In some embodiments, the processor comprises: a second voltage regulator coupled to the second power supply node, the second voltage regulator to generate the second power supply. In some embodiments, the second VR to generate a voltage level of the second power supply to be higher than a voltage level of the first power supply.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first power supply node to provide a first power supply;
a second power supply node to provide a second power supply;
a driver to operate on the first power supply, the driver to generate an output; and
a receiver to operate on the second power supply, the receiver to receive the output from the driver and to generate a level-shifted output such that the receiver is operable to steer current from the second power supply node to the first power supply node,
wherein the receiver comprises:
a first transistor connected to the second power supply node, and wherein the first transistor is to receive the output of the driver;
a second transistor coupled in series with the first transistor, wherein the second transistor to receive the output of the driver, wherein the second transistor is a second p-type transistor; and
a third transistor coupled to a source or drain terminal of the second transistor such that a gate terminal of the third transistor is coupled to the drain terminal of the second transistor.

2. The apparatus of claim 1, wherein a voltage level of the second power supply is higher than a voltage level of the first power supply.

3. The apparatus of claim 1, wherein the first transistor is a first p-type transistor.

4. The apparatus of claim 3, wherein the third transistor is a third p-type transistor.

5. The apparatus of claim 4, wherein a source or drain terminal of the third p-type transistor is coupled to the gate terminal of the first p-type transistor.

6. The apparatus of claim 4, wherein the receiver comprises a fourth p-type transistor coupled in series with the third type transistor such that a source or drain terminal of the fourth p-type transistor is coupled to the gate terminal of the first p-type transistor.

7. The apparatus of claim 4, wherein the receiver comprises a first n-type transistor coupled in series with the second p-type transistor, the first n-type transistor having a gate terminal to receive the output from the driver.

8. The apparatus of claim 1, wherein the driver comprises an inverter that receives an input and generates the output.

9. A system comprising:
a memory;
a processor coupled to the memory, the processor having a level-shifter which includes:
a first power supply node to provide a first power supply;
a second power supply node to provide a second power supply;
a driver to operate on the first power supply, the driver to generate an output; and
a receiver to operable on the second power supply, the receiver to receive the output from the driver and to generate a level-shifted output such that the receiver is operable to steer current from the second power supply node to the first power supply node,
wherein the receiver comprises:
a first transistor connected to the second power supply node, and wherein the first transistor is to receive the output of the driver;
a second transistor coupled in series with the first transistor, wherein the second transistor to receive the output of the driver, wherein the second transistor is a p-type transistor; and
a third transistor coupled to a source or drain terminal of the second transistor such that a gate terminal of the third transistor is coupled to the drain terminal of the second transistor; and
a wireless interface for allowing the processor to communicate with another device.

10. The system of claim 9, wherein the processor comprises:
a first voltage regulator coupled to the first power supply node, the first voltage regulator to generate the first power supply.

11. The system of claim 10, wherein the processor comprises:
a second voltage regulator coupled to the second power supply node, the second voltage regulator to generate the second power supply.

12. The system of claim 11, wherein the second voltage regulator is to generate a voltage level of the second power supply to be higher than a voltage level of the first power supply.

13. The system of claim 9, wherein the steered current is to reduce a voltage potential at a node of the receiver.

* * * * *